United States Patent [19]

Wilson

[11] Patent Number: 5,174,763

[45] Date of Patent: Dec. 29, 1992

[54] CONTACT ASSEMBLY

[75] Inventor: Albert H. Wilson, Los Angeles, Calif.

[73] Assignee: ITT Corporation, Secaucus, N.J.

[21] Appl. No.: 807,666

[22] Filed: Dec. 16, 1991

Related U.S. Application Data

[63] Continuation of Ser. No. 535,689, Jun. 11, 1990, abandoned.

[51] Int. Cl.[5] .............................................. H01R 9/09
[52] U.S. Cl. ........................................ 439/66; 439/81; 439/75; 439/245; 439/248; 439/591; 439/482; 439/840
[58] Field of Search ................. 439/65, 66, 75, 80, 439/81, 91, 595, 739, 728, 277, 245, 248, 908, 840, 912, 482, 824

[56] References Cited

U.S. PATENT DOCUMENTS

| | | | |
|---|---|---|---|
| 1,224,907 | 5/1917 | Douglas | 439/737 |
| 1,347,738 | 7/1920 | Douglas | 439/701 |
| 2,480,963 | 9/1949 | Quinn | 173/323 |
| 2,705,308 | 3/1955 | Howard | 439/700 |
| 2,914,740 | 11/1959 | Blonder | 333/97 |
| 3,212,015 | 10/1965 | Kruse | 329/162 |
| 3,416,125 | 12/1968 | Theve | 339/177 |
| 3,771,110 | 11/1973 | Reed | 339/214 |
| 4,029,375 | 6/1977 | Gabrielian | 439/824 |
| 4,200,351 | 4/1980 | Long et al. | 339/108 |
| 4,307,928 | 12/1981 | Petlock, Jr. | 339/254 |
| 4,358,175 | 11/1982 | Reid | 339/75 |
| 4,397,519 | 8/1983 | Cooney | 339/255 |
| 4,403,822 | 9/1983 | Smith | 439/824 |
| 4,413,874 | 11/1983 | Williams | 339/151 |
| 4,528,500 | 7/1985 | Lightbody et al. | 439/66 |
| 4,611,213 | 9/1986 | Johnson et al. | 343/702 |
| 4,743,201 | 5/1988 | Robinson et al. | 439/824 |
| 4,889,496 | 12/1989 | Neidich | 439/81 |

FOREIGN PATENT DOCUMENTS

| | | |
|---|---|---|
| 0197637 | 2/1986 | European Pat. Off. . |
| 0248521 | 4/1987 | European Pat. Off. . |
| 3500227 | 1/1985 | Fed. Rep. of Germany . |
| 2166913 | 9/1985 | United Kingdom . |

OTHER PUBLICATIONS

IBM Technical Disclosure Bulletin; vol. 20, No. 5 (Oct., 1977) Quick Disconnect Coaxial Connector, Y. E. Chang, A. L. Perlman and K. Schmadtke.

*Primary Examiner*—Paula A. Bradley
*Attorney, Agent, or Firm*—Thomas L. Peterson

[57] ABSTRACT

A contact assembly is provided for connecting pairs of terminals of two circuits, which allows terminals to be positioned at high densities with minimum crosstalk, selected impedances, and minimum inductances for fast pulse rise times. The apparatus includes a dielectric frame (30, FIG. 2) having multiple miniature cavities (46), and an extendable contact assembly (26) lying in each cavity and having a pair of probes (32, 34) projecting from opposite faces of the frame. The two probes of each contact assembly are slideably engaged and are biased apart by a spring (70), the spring being constructed of dielectric material to avoid inductances and to allow for a high characteristic impedance. The frame can include a body (104, FIG. 6) having multiple plated through holes or cavities (106), and end wall structures (114) having dielectric bushings (122) shorter than the body holes and fitting into the body cavities.

7 Claims, 3 Drawing Sheets

CONTACT ASSEMBLY

This is a continuation of application Ser. No. 535,689 filed Jun. 11, 1990 now abandoned.

BACKGROUND OF THE INVENTION

Modern high speed, high density circuitry often requires contacts with very close center-to-center spacings of less than 0.050 inch. Such close spacing can be achieved by spring probe compression contacts, wherein each contact has a spring biased probe whose tip can press against a conductive pad on a circuit board. U.S. Pat. No. 4,200,351 shows a compression contact wherein a spring-biased plunger projects from one face of a dielectric support to contact a conductive pad on a circuit board.

While compression contacts allow for high densities of contacts, they can create problems. The close spacing of the contacts can lead to crosstalk. Also, if each contact lies close to a grounded shield, the characteristic impedance of the contact may be too low. It may be noted that coaxial cable configurations generally employ three impedance levels: 50, 70, and 93 ohms. Any metal spring around the contact increases its effective diameter and therefore decreases the characteristic impedance. Furthermore, any metal spring can add appreciable inductance to the contact which is detrimental to the transmission of high speed data signals. Many present applications require a pulse rise time of less than 32 picoseconds, which cannot be achieved if there is appreciable inductance. A contact arrangement which allowed close spacing of contacts, while minimizing crosstalk, minimizing inductance, and allowing control of impedance especially to allow for relatively high impedance, would be of considerable value.

SUMMARY OF THE INVENTION

In accordance with one embodiment of the present invention, a contact apparatus is provided to facilitate high contact densities, while minimizing crosstalk and inductances, and which can facilitate control of impedance. The apparatus can include a frame of dielectric material having a plurality of cavities that each hold an extendable contact assembly. Each contact assembly includes at least one probe projecting through a hole in the frame to project from a face of the frame, the probe being deflectable when a contact pad is pressed thereagainst. A spring device that biases the probe is preferably formed of dielectric material to minimize inductance and allow for a small diameter contact assembly. The contact assembly can include two probes with tips that project from opposite faces of the frame, with the two probes being permanently slideably engaged.

The contact apparatus can include a body with plated-through holes and end wall structure with bushing portions that fit into the holes. The length and dielectric constant of the bushing portions can control the characteristic impedance of each coaxial conductor formed by a contact assembly in the hole and the grounded plating that lines the hole.

The novel features of the invention are set forth with particularity in the appended claims. The invention will be best understood from the following description when read in conjunction with the accompanying drawings.

DESCRIPTION OF THE PREFERRED EMBODIMENT

Figure 1:
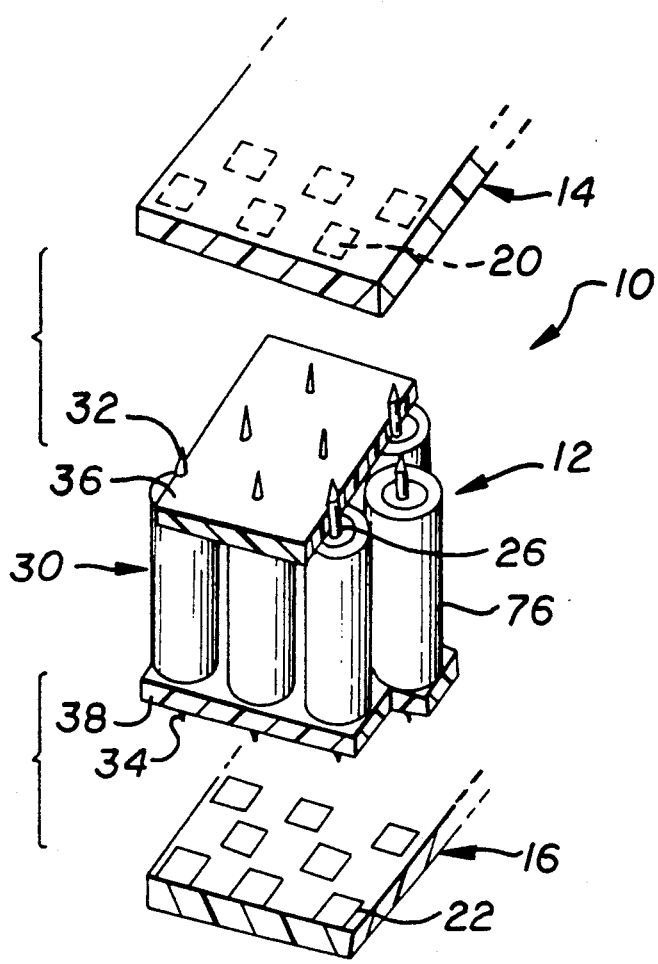
FIG. 1 is an exploded perspective view of a circuit assembly which includes a compression contact apparatus of the present invention and a pair of circuit boards that can be interconnected through the apparatus.

FIG. 1 illustrates a circuit assembly 10 which includes a compression contact apparatus 12 of the present invention which can be used to interconnect a pair of electrical circuits such as those on a pair of circuit boards 14, 16. The first circuit board 14 has terminals or contact pads 20 which are to be connected to corresponding pads 22 on the other circuit board. The contact apparatus 12 has numerous contact assemblies 26 that can interconnect pairs of corresponding pads 20, 22. Each contact assembly 26 lies in a dielectric frame 30 and has a pair of probes 32, 34 projecting from opposite faces 36, 38 of the frame.

Figure 2:
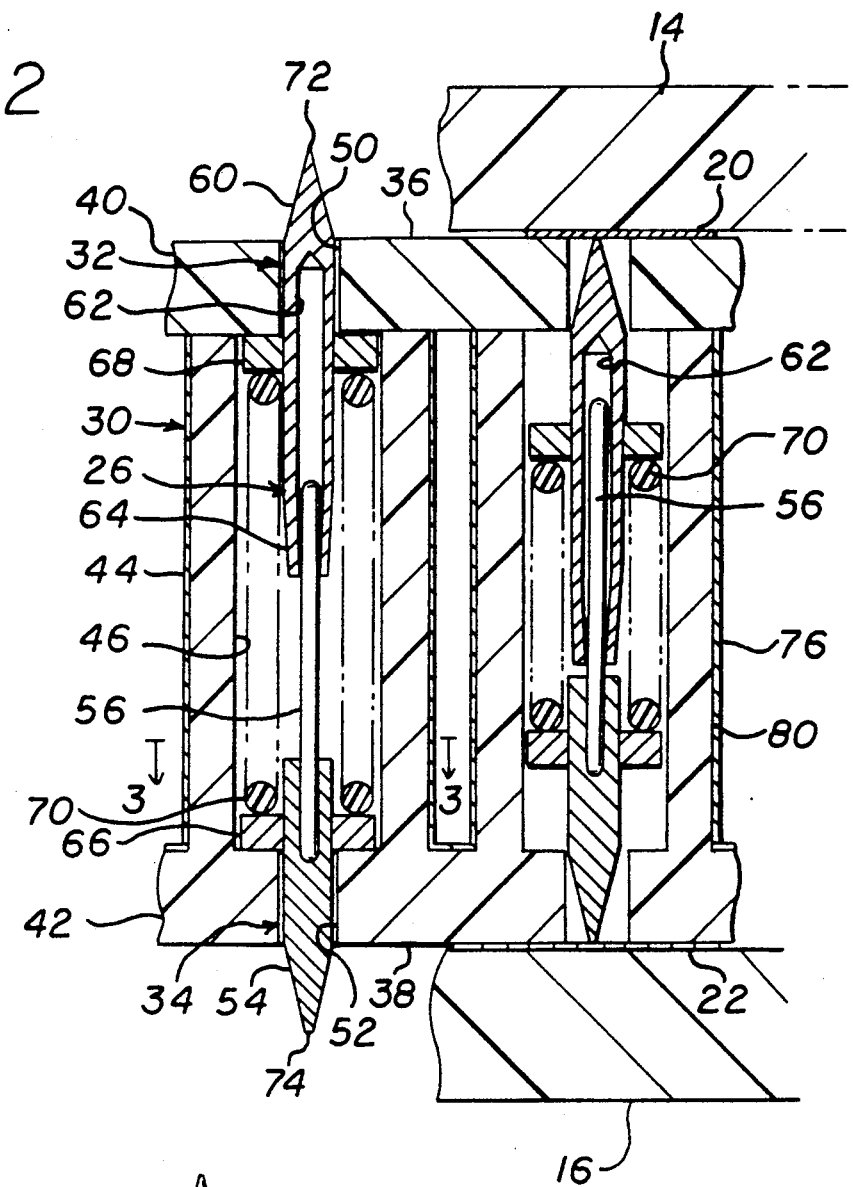
FIG. 2 is a sectional view of the compression contact apparatus of FIG. 1, showing two contact assemblies, with one in an uncompressed state and the other in a fully compressed state.

As shown in FIG. 2, the frame 30 has first and second ends walls 40, 42 and has side walls 44 extending between the end walls. The frame forms multiple cavities 46 between the walls, with each contact assembly 26 lying largely in one of the cavities. The end walls 40, 42 each has multiple holes 50, 52, and the probes 32, 34 project from the cavity through corresponding holes in the end walls, and initially beyond the opposite faces 36, 38 of the frame.

The second probe 34 of each contact assembly includes a lower or outer portion 54 and an upwardly extending pin portion 56. It should be noted that the terms "lower", "upwardly", etc. refer to parts as illustrated, but not necessarily to their orientation in actual use. The first probe 32 includes an upper or outer portion 60 which has a bore 62 that slideably receives the pin portion 56 of the other probe. The bottom or inner portion 64 of the first probe forms fingers that resiliently engage the pin portion 56 to maintain electrical contact between the two probes 32, 34 as they telescope, or slide together and apart.

Each probe has a flange 66, 68 fixed to the rest of the corresponding probe. A spring device 70, shown here as a coil spring, extends between the flanges of the two probes. The spring is preloaded in compression, so it constantly urges the tips 72, 74 of the probes away from each other and outward from a corresponding face of the frame.

When the two circuit boards 14, 16 are pressed against the opposite faces 36, 38 of the frame, they deflect the probe tips inwardly until they lie substantially flush with the faces of the frame, with the tips of the probes contacting the conductive pads 20, 22 on the circuit boards. In this way, the pads 20, 22 of the circuit boards are interconnected. During inward movement of the probes, the spring 70 is compressed and the pin portion 56 of the lower probe slides more deeply into the bore 62 of the upper probe.

The use of compression contacts allows the contact assemblies to lie close together. This can lead to crosstalk between adjacent contacts. To minimize such crosstalk, applicant forms the side walls 44 to provide a separate side enclosure 76 around each contact assembly, and plates the outside of each side enclosure with a plating 80 of conductive material. Inasmuch as the plating around all contact assemblies are at the same potential such as ground, they are interconnected. The plating is connected to a ground terminal of one or both of the circuit boards through a contact (not shown).

Where the contact assemblies carry high frequencies or pulses with short rise times (current rise times are often less than 32 picoseconds) it is important that each contact assembly have minimum inductance, inasmuch as inductance tends to filter out higher frequencies and increase the rise time of pulses. A potential source of high inductance is the coil spring 70. Applicant avoids the introduction of inductance from the coil spring 70 by constructing the spring of dielectric material such as of Nylon which is a nonelastomeric plastic. By avoiding the presence of a long and large diameter electrically conductive element in the contact assembly, applicant also produces a contact assembly of small equivalent outside diameter, the equivalent outside diameter being somewhere between the outside diameter of the pin portion 56 and of the outer portions 54, 60 of the probes.

It is often desirable to establish a controlled characteristic impedance for each contact assembly. Coaxial impedance cables generally have an impedance of 50, 70, or 93 ohms, and it is often desirable to match the characteristic impedance of the contact assemblies to that of coaxial conductors on the circuit boards. The characteristic impedance of a contact assembly may be lower than desired. The impedance can be increased by increasing the distance between the center conductor, formed by the contact assembly 26, the outer conductor formed by the plating layer 80 surrounding it. By avoiding a spring of electrically conductive material, applicant produces a contact assembly of small equivalent outside diameter, to enable a higher characteristic impedance to be produced. It is possible to construct the flanges 66, 68 that are attached to the probes, of dielectric material, to further decrease the equivalent outside diameter of each contact assembly.

Figure 3:
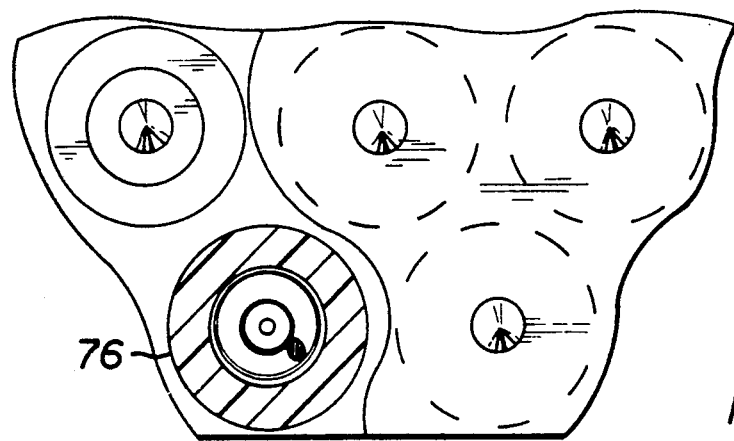
FIG. 3 is a plan view of the compression contact apparatus of FIG. 1, with a portion as seen on line 3—3 of FIG. 2 and another portion as seen with the upper wall of FIG. 2 removed.
Figure 4:
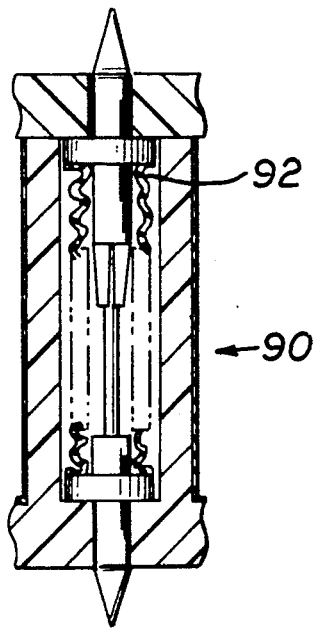
FIG. 4 is a partial sectional view of another contact apparatus with another form of spring device.
Figure 5:
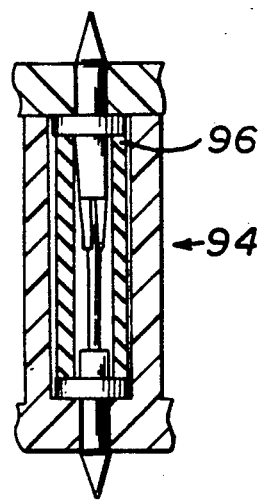
FIG. 5 is a partial section view of contact apparatus with still another form of spring device.

FIG. 4 illustrates another compression contact apparatus 90 that is similar to that of FIGS. 1-3, except that it uses a spring device 92 formed by a bellows of dielectric material such as Nylon. FIG. 5 is a view of still another contact apparatus 92, which is similar to that of FIGS. 1-3, except that its spring device 96 is formed by a tube of elastomeric material such as rubber.

Figure 6:
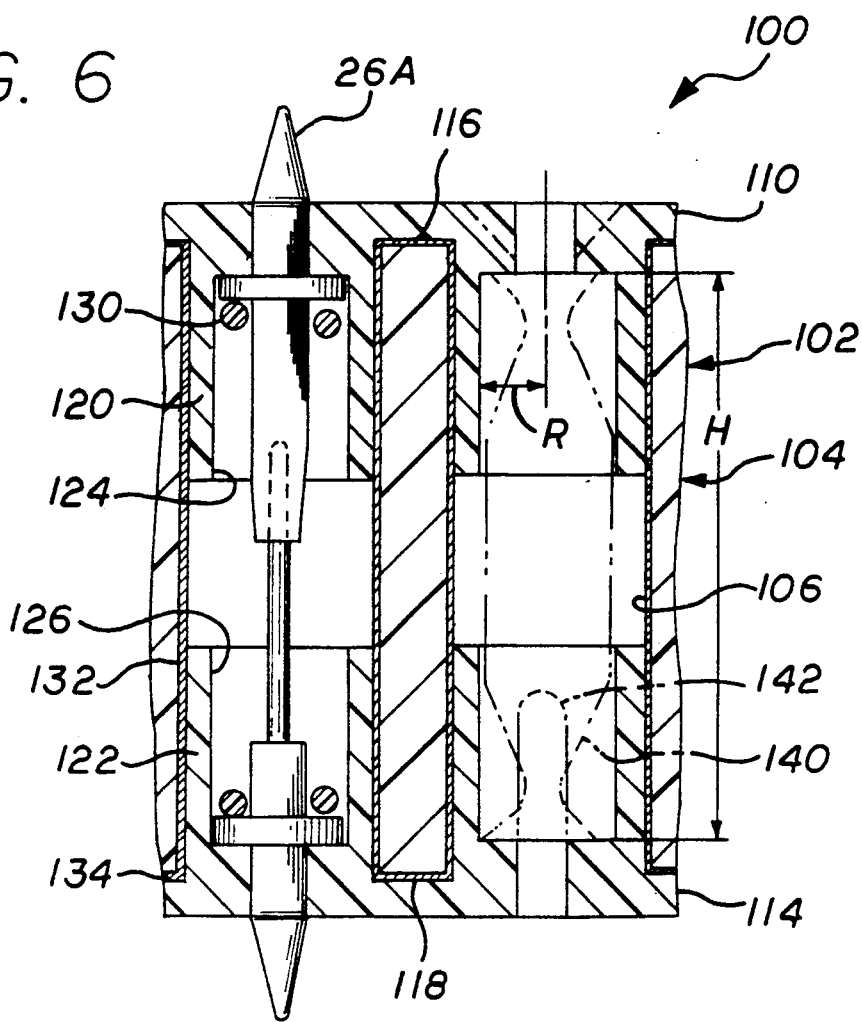
FIG. 6 is a sectional view of a contact assembly constructed in accordance with another embodiment of the invention.
Figure 7:
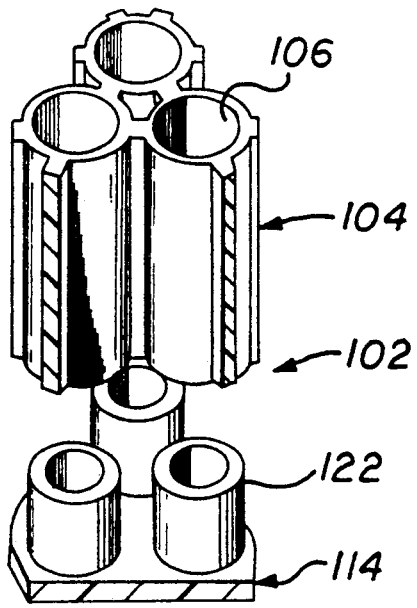
FIG. 7 is a partial perspective exploded view of the assembly of FIG. 6.

FIG. 6 illustrates another contact apparatus 100 which includes a frame 102 that can hold contact assemblies such as a pressure contact assembly 26A that is similar to that of FIGS. 1-5. The frame 102 includes a body 104 with multiple through holes or cavities 106. Two end wall structures 110, 114 lie against the opposite faces 116, 118 of the body. Each end wall structure includes bushing portions 120, 122 that fit into the cavities 106. For the pressure contact assembly 26A, the bushing portions form holes 124, 126 that receive end portions of a dielectric spring 130 to control the position of the spring.

Each cavity 106 has an internal surface portion 132 formed of metal, which can be achieved by molding the body 104 of plastic and plating it. The surface portions 132 of some or all of the cavities are interconnected, as by extending the plating as at 134 to interconnect the plating portions at the insides of different cavities. The plating is at a controlled potential, such as ground. This forms a coaxial conductor at each contact assembly, with the metal surface portion or plating 132 forming the grounded outer conductor and the contact assembly such as 26A forming the inner conductor.

It is often important to construct coaxial cables and connectors so they have a predetermined impedance that matches the impedance of other parts of a circuit connected to it. The use of bushing portions 120, 122 that lie between the contact assembly such as 26A and the grounded plating 132 enables close control of the characteristic impedance of each coaxial connector formed by a contact assembly 26A and a grounded layer 132. This is because the characteristic impedance of a coaxial conductor is dependent on the material between its conductors. Specifically, the characteristic impedance is proportional to the inverse of the square root of the dielectric constant of material between the inner and outer coaxial conductors. Where a high characteristic impedance is desired, the bushing portions 120, 122 can be of material of low dielectric constant, and can be short so that almost the entire volume between the inner and outer conductors is filled with air. Where a low characteristic impedance is desired, the bushing portions 120, 122 can be long so their combined length is almost equal to the length of the holes 106, and the bushing portions can be formed of material of high dielectric constant. In any case, the bushing portions are formed of dielectric material.

The strength of the contact assembly frame 102 is primarily in the body 104, so the end wall structures 110, 114 and their bushing portions can be constructed of low strength material. It may be noted that the body 104 can be constructed entirely of metal, although it is generally easier to form it of molded plastic and to plate the plastic.

Although the pressure contact assemblies 26A can be used in the frame 102, the frame can also be used to hold other contact assemblies such as one illustrated at 140 which is designed to receive pin contact such as illustrated at 142.

Thus, the invention provides a contact apparatus which is of simple construction and which has minimal inductance. The apparatus can include compression contact assemblies lying in cavities of a frame, with each contact assembly having at least one probe tip projecting from a face of the frame but being resiliently depressible inwardly. A spring that biases the probe outwardly, is formed of dielectric material. Each contact assembly can include two probes projecting from holes in opposite end walls of the frame and with the probes in permanent sliding contact with each other. A variety of dielectric spring devices can be used to outwardly bias the probes, including a coil spring, a bellows, a tube of elastomeric material, or a collapsing hourglass shape. The frame can include a body with plated cavities, and end wall structures having bushings that project into the cavities and control the characteristic impedance.

Although particular embodiments of the invention have been described and illustrated herein, it is recognized that modifications and variations may readily occur to those skilled in the art, and consequently, it is intended that the claims be interpreted to cover such modifications and equivalents.

I claim:

1. Compression contact apparatus comprising:
   a frame having first and second end walls, a plurality of cavities between said end walls, and a plurality of holes in each end wall, each hole extending into one of said cavities;
   an extendable contact assembly lying in each of a plurality of said cavities, each contact assembly including a pair of probes projecting through holes at opposite ends of a corresponding one of said cavities and electrically connected together, and a spring device in said cavity which urges said pair of probes apart;
   each of said spring devices comprising a coil spring constructed of a nonelastomeric plastic dielectric material to avoid the passage of current through said coil spring.

2. Compression contact apparatus for connecting pairs of conductive pads on two circuit boards or the like, comprising:
   a frame of dielectric material having parallel first and second opposite faces;
   a plurality of contact assemblies, each having first and second probes with tips projecting from said opposite faces but being moveable into a corresponding frame face by a conductive pad pressed towards the corresponding frame face and being moveable out of the corresponding frame face, said first probe having a bore in an end opposite its tip, and said second probe having a pin portion slideably received in the bore of the first probe;
   each contact assembly also including a spring device biasing said first and second probes to urge their tips out of corresponding frame face.

3. The apparatus as described in claim 2 wherein:
   the spring device of each contact assembly is constructed of dielectric material.

4. Contact apparatus comprising:
   a frame which includes a body having a face and a plurality of cavities extending into said face, and at least one wall structure lying over said face and having a plurality of apertures for passing contacts, said wall structure including a plurality of dielectric bushing portions projecting into said cavities;
   a plurality of contact assemblies, each lying in one of said holes;
   said cavities having walls of electrically conductive material, with the conductive material of said plurality of cavities connected together, but with each contact assembly being electrically isolated from the conductive material at the walls of its cavity.

5. Compression contact apparatus comprising:
   a frame of dielectric material having first and second end walls, a plurality of cavities between said end walls, and a plurality of holes in each end wall, each hole extending into one of said cavities;
   an extendable contact assembly lying in each of a plurality of said cavities, each contact assembly including a pair of probes projecting through holes at opposite ends of a corresponding one of said cavities, and a spring device constructed of dielectric material in said cavity which urges said pair of probes apart;
   said first probe has walls forming a bore with an opening in one end thereof which is closet to second probe, and said second probe having a pin slideably received in said first probe bore;
   said first and second probes each have a flange lying in said cavity, and said spring device lies about said pin and has opposite ends bearing against said flanges.

6. Compression contact apparatus comprising:
   a frame of dielectric material having first and second end walls, a plurality of cavities between said end walls, and a plurality of holes in each end wall, each hole extending into one of said cavities;
   an extendable contact assembly lying in each of a plurality of said cavities, each contact assembly including a pair of probes projecting through holes at opposite ends of a corresponding one of said cavities, and a spring device constructed of dielectric material in said cavity which urges said pair of probes apart;
   said frame includes a plurality of side enclosures projecting from said second end wall, each side enclosure surrounding one of said contact assemblies, and said side enclosures being spaced apart; and including
   conductive material covering the outside of each side enclosure.

7. Contact apparatus comprising:
   a frame which includes a body having a face and a plurality of cavities extending into said face, and at least one wall structure lying over said face and having a plurality of apertures for passing contacts, said wall structure including a plurality of dielectric bushing portions projecting into said cavities;
   a plurality of contact assemblies, each lying in one of said holes;
   said cavities having walls of electrically conductive material, with the conductive material of said plurality of cavities connected together;
   said body has a predetermined thickness and said cavities extend through the entire thickness of said body, said body having first and second faces;
   said frame includes a second wall structure lying over said second body face and having apertures and having bushing portions projecting into said cavities.

* * * * *